United States Patent
Jiang et al.

(10) Patent No.: US 12,164,476 B2
(45) Date of Patent: Dec. 10, 2024

(54) METHOD FOR REAL-TIME EXTRACTION OF ON-CHIP SIMULATION INFORMATION

(71) Applicant: Xpeedic Co., Ltd., Shanghai (CN)

(72) Inventors: Liguo Jiang, Shanghai (CN); Feng Ling, Shanghai (CN); Yeliang Tang, Shanghai (CN); Wenliang Dai, Shanghai (CN)

(73) Assignee: XPEEDIC CO., LTD., Shanghai (CN)

( * ) Notice: Subject to any disclaimer, the term of this patent is extended or adjusted under 35 U.S.C. 154(b) by 0 days.

(21) Appl. No.: 18/251,749

(22) PCT Filed: Mar. 17, 2021

(86) PCT No.: PCT/CN2021/081277
§ 371 (c)(1),
(2) Date: May 4, 2023

(87) PCT Pub. No.: WO2022/110578
PCT Pub. Date: Jun. 2, 2022

(65) Prior Publication Data
US 2023/0409531 A1 Dec. 21, 2023

(30) Foreign Application Priority Data
Nov. 24, 2020 (CN) .......................... 202011334151.2

(51) Int. Cl.
*G06F 16/00* (2019.01)
*G06F 16/17* (2019.01)
*G06F 16/22* (2019.01)

(52) U.S. Cl.
CPC .......... *G06F 16/1734* (2019.01); *G06F 16/22* (2019.01)

(58) Field of Classification Search
CPC ...................................................... G06F 16/22
See application file for complete search history.

(56) References Cited

U.S. PATENT DOCUMENTS

| 2004/0034857 A1 | 2/2004 | Mangino et al. |
| 2009/0228847 A1* | 9/2009 | Suaya .................. G06F 30/398 |
| | | 716/136 |

FOREIGN PATENT DOCUMENTS

| CN | 106027406 A | 10/2016 |
| CN | 111488314 A | 8/2020 |

(Continued)

OTHER PUBLICATIONS

PCT/ISA/210 dated Aug. 21, 2021 issued in application No. PCT/CN2021/081277.

(Continued)

*Primary Examiner* — Ajith Jacob
(74) *Attorney, Agent, or Firm* — McClure, Qualey & Rodack, LLP

(57) ABSTRACT

A method for real-time extraction of on-chip simulation information including acquiring simulation job information, and analyzing the simulation job information to obtain option and parameter information; and acquiring index information from a simulation project according to the option and the parameter information, and formatting the index information to obtain a simulation result. According to said method, key information of a simulation result is extracted in real time by performing text scanning and pattern analysis on a log file during a simulation process, so that a user can conveniently learn about the progress situation of the current simulation task at any time, and determine to continue or terminate the task at any time according to the current state and result situation, thereby more flexibly controlling a flow according to an actual situation, simplifying operations, increasing design efficiency, and compensating for the disadvantages of traditional simulation methods.

6 Claims, 1 Drawing Sheet

(56) References Cited

FOREIGN PATENT DOCUMENTS

| | | |
|---|---|---|
| CN | 111611302 A | 9/2020 |
| CN | 111680078 A | 9/2020 |

OTHER PUBLICATIONS

English translation of PCT/ISA/210 dated Aug. 21, 2021 issued in application No. PCT/CN2021/081277.

* cited by examiner

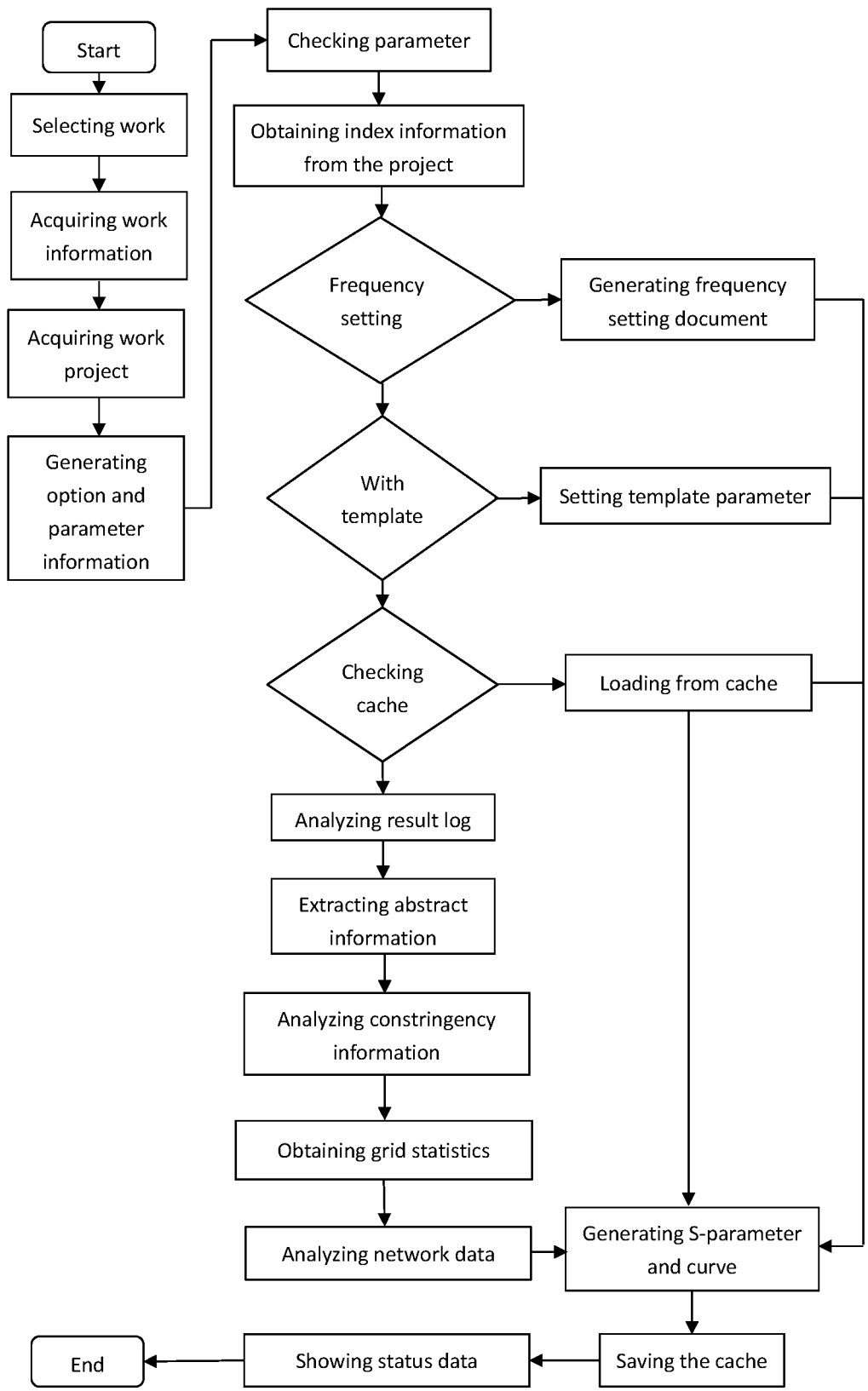

METHOD FOR REAL-TIME EXTRACTION OF ON-CHIP SIMULATION INFORMATION

TECHNICAL FIELD

The present invention belongs to the technical field of simulation software tools, specifically a method for real-time extraction of on-chip simulation information.

BACKGROUND TECHNOLOGY

Simulation is an important part of electronic design automation, and is a vital method to conduct analog verification in electronic design making use of computation capability of computers. Electronic design automation (EDA) is a design approach for completing design flows such as functional design, integration, verification, physical design (including laying out, wiring, patterning, design rule inspection etc.) with computer-aided design software. As scale of the semi-conductor industry is increasingly large in electronic industries, EDA is playing a more and more important role.

During development, there are some forms of simulation, at the very beginning, after design, the designer runs simulation locally, however, due to limited resources, and that users can only continue to use the design software to conduct subsequent work after conclusion or termination of simulation, design efficiency is very low. With the development of cluster and distributed technologies, after design users can submit the simulation to the cluster for simulation, a cluster computation management tool will manage the simulation work, however, as cluster operations are basically invisible, users can only wait until conclusion of the simulation work to open the results and see whether the design is satisfactory. Although cluster computation improves calculation efficiency significantly, during simulation pendency users have no access to the status until conclusion of the simulation; therefore, for those having a large quantity of simulation demands, the efficiency of the work flow is not high enough.

SUMMARY OF THE INVENTION

1. The Technical Problem to be Solved

A purpose of the present invention is to address the problem that it is not possible to access quickly and conveniently simulation results with the simulation work flows currently available until conclusion of the simulation work.

2. Technical Solutions

To realize the foregoing purpose, the technical solution provided by the present invention is:

A method for real-time extraction of on-chip simulation information according to the present invention, comprising, acquiring simulation work information and analyzing the simulation work information and obtaining option and parameter information; acquiring index information based on the option and parameter information, formatting the index information and obtaining simulation results.

Preferably, the method comprises specifically following steps:

S100, acquiring the simulation work information;
S200, obtaining the option and parameter information based on the simulation work information;
S300, checking the parameter information and acquiring the index information from simulation projects;
S400, setting simulation parameters based on the parameter information and the index information;
S500, checking cache according to setting, loading log information from the cache; or
When the log information has not been acquired from the cache, acquiring result log documents according to the index information;
Scanning and conducting pattern analysis for the result log documents and acquiring abstract information and formatting;
S600, obtaining frequency point and constringency information from the result and formatting;
S700, obtaining grid statistic information and formatting;
S800, analyzing data and generating an S-parameter document, and conducting parameter curve drafting based on the simulation parameters obtained in the step S200 and the step S400;
S900, chunking data obtained in the steps S500-S800, sending the chunked data to front ends, while the front ends formatting and displaying according to data formats.

Preferably, formatting in the steps S500-S700 comprises removing meaningless words from original information, sorting out the original information to be text in a uniform format so to have the front ends to display in a standardized format.

Preferably, the simulation work information in the step S100 comprises title of work, data content, engineering documents and type of work.

Preferably, the option and parameter information comprises parameters for use in engineering work and result analysis.

Preferably, scanning the result log documents and conducting pattern analysis therefor comprises:

Scanning, scanning line by line the log documents; Pattern analysis, analyzing with pattern matching methods and extracting key information from analysis results.

Preferably, obtaining the frequency point and constringency information from the result comprises specifically grouping information output per frequency point in the work result logs as per frequency point, analyzing constringency information in each of the frequency points and forming a list of constringency information for each of the frequency points.

3. Beneficial Effects

The extraction method as provided according to the technical solutions in the present invention has the following beneficial effects compared with the prior art:

The method for real-time extraction of on-chip simulation information, comprising obtaining simulation work information, analyzing the simulation work information and obtaining option and parameter information; obtaining index information according to the option and parameter information from simulation projects and formatting the index information and obtaining simulation results. With the present method, during simulation, key information regarding the simulation results are extracted in real time by text scanning and pattern analysis of the log documents, so that users can know at any time development conditions of the current simulation task, deciding to continue or terminate the task based on the current status and result conditions, so that working flows can be controlled as per actual conditions more flexibly, operations are simplified, design efficiency is improved and efficiency and flexibility deficiency of conventional simulation methods is compensated.

BRIEF DESCRIPTION OF DRAWINGS

FIG. 1 is a flow chart diagram showing a method for real-time extraction of on-chip simulation information.

EMBODIMENTS

To help understanding the present invention, hereinafter a more complete description will be given to the present invention based on corresponding drawings, in the drawings some embodiments of the present invention are set forth, however, the present invention can be implemented in many different forms, and is not limited to the embodiments described here, and the purpose of providing the embodiments to have the disclosure of the present invention more thorough and complete.

It is to be noted that, when a component is "fixed" on the other component, it can be directly fixed on the other component or there can be an intermediate component; when a component is described to be "connected" with the other component, the connection can be direct connection or there may be an intermediate component; terms "vertical", "horizontal", "left", "right" and similar descriptions in the present invention are only for explanation purpose.

Unless defined otherwise, all technological and scientific terms used in the present invention have the same meaning as understood by those skilled in the art; terms used in the description of the present invention are only for the purpose of depicting the embodiments rather than limiting the present invention; the terms "and/or" used in the present invention comprises random and all combinations of the one or more listed items.

Embodiment 1

With reference to FIG. 1, a method for real-time extraction of on-chip simulation information, comprising, acquiring simulation work information, analyzing the simulation work information and obtaining options and parameters information; acquiring index information from simulation projects according to the options and parameters information, formatting the index information and obtaining simulation results. Key information regarding the simulation results has been extracted in real time by text scanning and pattern analysis from log documents during simulation, so that users can know at any time development conditions of the current simulation task, decide to continue or terminate the task according to the current status and result conditions, so as to control the flow process as per actual conditions, in this way, operations are simplified, design efficiency is improved, and deficiency of conventional simulation in efficiency and flexibility is compensated.

The method comprises the following steps:

S100, acquiring simulation work information;

S200, obtaining options and parameters information according to the simulation work information;

S300, checking parameters information and obtaining index information from simulation projects;

S400, setting simulation parameters according to the parameters information and the index information;

S500, checking cache according to setting, loading log information from the cache; or When the log information has not been acquired from the cache, obtaining result log documents according to the index information;

Scanning and conducting pattern analysis for the result log documents and obtaining abstract information and formatting the same;

S600, acquiring frequency point and constringency information in the results, formatting the same;

S700, acquiring grid statistic information and formatting the same;

S800, analyzing the data and generating an S-parameter document, drafting a parameter curve with the S-parameter document and the parameter data in the step S200 and the step S400; and S900, chunking the data obtained in the steps S500-S800 and sending to the front end, and the front end will in turn format the data according to formats of the data.

Formatting in the steps S500-S700 comprises specifically eliminating meaningless text from original information output by the simulation work, making the data to be text of uniform format as per display requirements, so that the front end can display the information in a standardized format.

The simulation work information in the step S100 comprises work title, data content, project documents and type of work.

The options and parameters information in the step S200 comprises parameters to be used in engineering work and result analysis.

Scanning and conducting pattern analysis for the result log documents comprises:

Scanning, scanning the log document line by line;

Conducting pattern analysis, analyzing with pattern matching methods, and extracting key information from analysis results.

Acquiring frequency point and constringency information from the results in the step S600 comprises specifically grouping the information output by each of the frequency points as per frequency point, analyzing the constringency information in each of the frequency points and forming the constringency information list for each of the frequency points.

Embodiment 2

The method is executed in the following steps:

(1) Selecting a work from simulation work management and opening proprietary information;

(2) Obtaining corresponding information according to selected work, the information comprises work ID, data content, engineering documents etc.;

(3) Obtaining the options and parameters information based on analysis to the engineering documents.

The information obtained here is mainly configured to provide options for the user and to group the data, however, depending on engineering types and contents, not all works need to provide options for the users to select. Effects finally presented in FIGS. 4 and 5 have no option for the users and the reason usually lies in the fact that the result for this kind of engineering work and the content analysis can have only one result and selection is not necessary.

(4) Checking parameter options:

Based on explanation given in the foregoing point (3), for work with options, parameter options comprise options, otherwise, parameter options comprise only parameters required for work project and result analysis, including whether to use cache and whether to draft a curve etc.

(5) Analyzing the project and obtaining the index information and project parameter information;

The index information comprises routine of log documents, routine of results etc., the parameter information comprises frequency setting, parameter templates etc.

(6) Checking the cache based on setting

If usage and existence of the cache is possible, loading logs and status information from the cache;

(7) If no information has been obtained from the cache, analyzing the result log and extracting information from the logs;

Result log analysis is the key of the method, and the result log analysis comprises obtaining the result log document based on index, scanning and conducting pattern analysis for the results. Scanning is primarily done line by line, pattern analysis is done by analyzing by pattern matching methods based on writing method of the work result logs and extracting key information from the analysis results.

For example, when scanning the following information:
*information*2020/08/13 22:32:28Number of unknowns: 1266

By pattern matching, chunk the information, extract the bolded information from known patterns and obtain the time and quantity indicated by this piece of information according to the format of the information.

(8) Obtaining the key data of the result information based on the foregoing analysis, analyzing and making the data to a further extent and obtaining final classified data.

The grouping information after analysis and trimming can be different when the types of work are different, generally, the results comprise the abstract information, the constringency information and the grid information of the task log, and may further include network information and S-parameter.

(9) In case the system supports a drawing module, the drawing module can be called to generated parameter curves.

(10) Finally, chunking the foregoing data and sending the same to the front end, and the front end will format and display the data as per formats of the data.

For the result analysis of the present method, JAVA text scanning and pattern recognition has been used, in this way, it is convenient for us to analyze the results and the analysis is quite efficient.

The foregoing embodiments show only some embodiments of the present invention, description of the embodiments are quite concrete and detailed, however, the description shall not be construed to be limitation to the protection scope of the present invention in any sense; it shall be pointed out that, for those of ordinary skill, without departing from the spirit of the present invention, several modifications and improvement can be made to the present invention and all these modifications and improvement fall into the protection scope of the present invention; therefore, the protection scope of the present invention shall be defined by the appended claims.

The invention claimed is:

1. A method for real-time extraction of on-chip simulation information, comprising, acquiring simulation work information and analyzing the simulation work information and obtaining option and parameter information; acquiring index information based on the option and parameter information, formatting the index information and obtaining simulation results, wherein the method comprises specifically following steps:
  (S100), acquiring the simulation work information;
  (S200), obtaining the option and parameter information based on the simulation work information;
  (S300), checking the parameter information and acquiring the index information from simulation projects;
  (S400), setting simulation parameters based on the parameter information and the index information;
  (S500), checking cache according to setting, loading log information from the cache; or
  when the log information has not been acquired from the cache, acquiring result log documents according to the index information;
  scanning and conducting pattern analysis for the result log documents and acquiring abstract information and formatting;
  (S600), obtaining frequency point and constringency information from the result and formatting;
  (S700), obtaining grid statistic information and formatting;
  (S800), analyzing data and generating an S-parameter document, and conducting parameter curve drafting based on the simulation parameters obtained in the step S200 and the step S400;
  (S900), chunking data obtained in the steps S500-S800, sending the chunked data to front ends, while the front ends formatting and displaying according to data formats.

2. The method for real-time extraction of on-chip simulation information according to claim 1, wherein formatting in the steps S500-S700 comprises removing meaningless words from original information, sorting out the original information to be text in a uniform format so to have the front ends to display in a standardized format.

3. The method for real-time extraction of on-chip simulation information according to claim 1, wherein the simulation work information in the step S100 comprises title of work, data content, engineering documents and type of work.

4. The method for real-time extraction of on-chip simulation information according to claim 1, wherein the option and parameter information comprises parameters for use in engineering work and result analysis.

5. The method for real-time extraction of on-chip simulation information according to claim 1, wherein scanning the result log documents and conducting pattern analysis therefor comprises:
  scanning, scanning line by line the log documents;
  pattern analysis, analyzing with pattern matching methods and extracting key information from analysis results.

6. The method for real-time extraction of on-chip simulation information according to claim 1, wherein obtaining the frequency point and constringency information from the result comprises specifically grouping information output per frequency point in the work result logs as per frequency point, analyzing constringency information in each of the frequency points and forming a list of constringency information for each of the frequency points.

* * * * *